United States Patent
Nakamoto

[19]

[11] Patent Number: 6,081,024
[45] Date of Patent: Jun. 27, 2000

[54] TAB TAPE SEMICONDUCTOR DEVICE

[75] Inventor: Satoshi Nakamoto, Tokyo, Japan

[73] Assignee: NEC Corporation, Tokyo, Japan

[21] Appl. No.: 09/065,516

[22] Filed: Apr. 24, 1998

[51] Int. Cl.[7] .......................... H01L 23/495; H01L 23/58; H01L 23/34
[52] U.S. Cl. .............................. 257/668; 257/48; 257/723
[58] Field of Search ............................... 257/668, 48, 723

[56] References Cited

U.S. PATENT DOCUMENTS

| | | | |
|---|---|---|---|
| 4,977,441 | 12/1990 | Ohtani et al. | 257/48 |
| 5,517,036 | 5/1996 | Semba et al. | 257/48 |

FOREIGN PATENT DOCUMENTS 2-52262  2/1990  Japan.

*Primary Examiner*—Teresa M. Arroyo
*Attorney, Agent, or Firm*—Young & Thompson

[57] ABSTRACT

A TAB tape semiconductor device includes a unit resin tape, a plurality of test pads, wiring patterns, and a plurality of semiconductor chips. The unit resin tape has a plurality of device holes. The plurality of test pads are formed on the unit resin tape. The wiring patterns are formed to extend radially from the device holes. The plurality of semiconductor chips are mounted in the plurality of device holes and connected to distal end portions of the wiring patterns through pads. The semiconductor chips are connected to each other through some of the wiring patterns.

3 Claims, 4 Drawing Sheets

TAB TAPE SEMICONDUCTOR DEVICE

BACKGROUND OF THE INVENTION

1. Field of the Invention

The present invention relates to a TAB tape semiconductor device formed by mounting a semiconductor integrated circuit chip in a device hole formed in a TAB tape and, more particularly, to a TAB tape semiconductor device which is formed to obtain a good test result.

2. Description of the Prior Art

A semiconductor integrated circuit, e.g., an exclusive IC such as an ASIC (Application Specific Integrated Circuit), is provided to the user usually in the form of a QFP (Quad Flat Package). In a conventional QFP, packaging is performed by connecting a semiconductor integrated circuit chip and a lead frame in accordance with wire bonding. In a peripheral type package such as a QFP, as the number of pins increases, the pitch of the pins becomes narrow, and it has become difficult to perform packaging with a method using wire bonding. For this reason, connection between the chip and the lead frame is made by using a semiconductor device called a TCP in which a semiconductor chip is mounted on a TAB tape. In this case, TCPs are usually separated into unit TCPs. Each unit TCP is mounted on a frame called a carrier, and is sent to an assembly process.

FIG. 1 is a plan view showing a conventional TAB tape semiconductor device. A TAB tape is formed of a resin tape 2 made of polyimide or the like, and wiring patterns 4 formed on it. A device hole 3 for mounting an integrated circuit chip therein is formed at the central portion of the resin tape 2. One end of each wiring pattern 4 has an inner lead 6 extending to the device hole 3 in a cantilever manner. A test pad 5 is formed on the other end of each wiring pattern 4. An integrated circuit chip 1 is mounted in the device hole 3, and chip pads 9 on the integrated circuit chip 1 are bonded to the distal end portions of the inner leads 6. The TAB tape on which the integrated circuit chip is mounted (this is called a TCP) is set on a carrier 7. Although a few wiring patterns are shown in FIG. 1 for the sake of illustrative convenience, about 500 to 800 leads are typically provided.

In the state shown in FIG. 1, a test is performed by using a testing system, e.g., an LSI tester. Since the number of pins increases, the packaging cost of the semiconductor device increases. The test is accordingly expected to perform highly precise evaluation. Due to the increase in the number of pins, the number of contacts in a relay portion extending from the LSI tester to the semiconductor device inevitably increases, and the wiring length increases accordingly. Therefore, a blunt or distortion in waveform has become serious. FIG. 2 is an equivalent circuit diagram showing the connection relationship between an LSI tester 20 and the integrated circuit chip 1 in the test.

As shown in FIG. 2, an input signal and a power supply voltage are supplied from an LSI tester 20 side driver 101 to an integrated circuit chip 1 side input circuit 105 through a test board transmission circuit 102a, a socket portion delay circuit 103a, and a TAB tape portion delay circuit 104a. A signal output from an integrated circuit chip 1 side output circuit 106 is input to an LSI tester 20 side comparator 107 through a TAB tape portion delay circuit 104b, a socket portion delay circuit 103b, and a test board transmission circuit 102b.

As the area of the semiconductor integrated device increases and the number of pins thereof increases, the size of the TAB tape increases, and the patterns on the TAB tape become narrow and elongated. As a result, the inductance component and capacitance component in the equivalent circuit of FIG. 2 increase to degrade the measurement environment. On the other hand, the operation speed of the semiconductor integrated circuit device increases, and accordingly a test for the semiconductor integrated circuit device at a high frequency has reached limitations.

As described above, as the size of the package increases and the number of pins increases, the assembly cost increases, and accordingly a TCP need be sufficiently tested. To sufficiently test a large-scale semiconductor integrated circuit device, a very large number of test patterns must be supplied at a high speed with waveforms free from a blunt or distortion.

The problem that should be solved by the present invention is to perform a high-precision test at a high frequency in a measurement environment which is degraded in accordance with an increase in size and operation speed of a semiconductor integrated circuit device and with an increase in size of a TAB tape, such that the test and evaluation are not adversely affected by degradation in signal waveform in a transmission circuit extending from the tester to the semiconductor integrated circuit device as a test target.

SUMMARY OF THE INVENTION

The present invention has been made in view of the above situation of the prior art, and has as its object to provide a TAB tape semiconductor device in which a waveform blunt and distortion in a signal in a transmission circuit are improved and a high-precision test can be performed at a high frequency even if the lead length on the TAB tape is increased because of an increase in the number of pins and in the size of the package that degrade the test environment.

In order to achieve the above object, according to the first aspect of the present invention, there is provided a TAB tape semiconductor device comprising a unit resin tape formed with a plurality of device holes, a plurality of test pads formed on the unit resin tape, wiring patterns formed to extend radially from the device holes, and a plurality of semiconductor chips mounted in the plurality of device holes and connected to distal end portions of the wiring patterns through pads, wherein the semiconductor chips are connected to each other through some of the wiring patterns.

According to the second aspect of the present invention, there is provided a TAB tape semiconductor device according to the first aspect, wherein a unit TAB tape having the resin tape and the wiring patterns is supported by a carrier having a frame structure.

According to the third aspect of the present invention, there is provided a TAB tape semiconductor device according to the first aspect, wherein two device holes are formed in the unit resin tape, a main semiconductor integrated circuit chip is mounted in one of the device holes, and a waveform shaping semiconductor integrated circuit chip for supplying a test signal to the main semiconductor integrated circuit chip is mounted in the other one of the device holes.

According to the fourth aspect of the present invention, there is provided a TAB tape semiconductor device according to the first aspect, wherein two device holes are formed in the one unit resin tape, a main semiconductor integrated circuit chip is mounted in one of the device holes, and a function testing semiconductor integrated circuit chip having a function of testing a functional block in the main semiconductor integrated circuit chip is mounted in the other one of the device holes.

According to the fifth aspect of the present invention, there is provided a TAB tape semiconductor device wherein a plurality of semiconductor integrated chips that are connected to each other through wiring patterns having a connection relationship of an actual device are mounted in the device holes.

As is apparent from the aspects described above, the TAB tape semiconductor device according to the present invention has a plurality of device holes, and integrated circuit chips mounted in these device holes are electrically connected to each other through wiring patterns on the TAB tape. Therefore, the test can be performed by utilizing a signal output from one integrated circuit chip as an input signal to another integrated circuit chip. As a result, the waveform blunt and distortion in the signal are improved, and the test can be performed at a high frequency. According to an embodiment in which a plurality of integrated circuit chips are mounted on the TAB tape so as to realize one system function, the test can be performed at a high speed with patterns that are input in an actual system.

The above and many other objects, features and advantages of the present invention will become manifest to those skilled in the art upon making reference to the following detailed description and accompanying drawings in which preferred embodiments incorporating the principles of the present invention are shown by way of illustrative examples.

DETAILED DESCRIPTION OF THE PREFERRED EMBODIMENTS

Several preferred embodiments of the present invention will be described with reference to the accompanying drawings.

Figure 1:
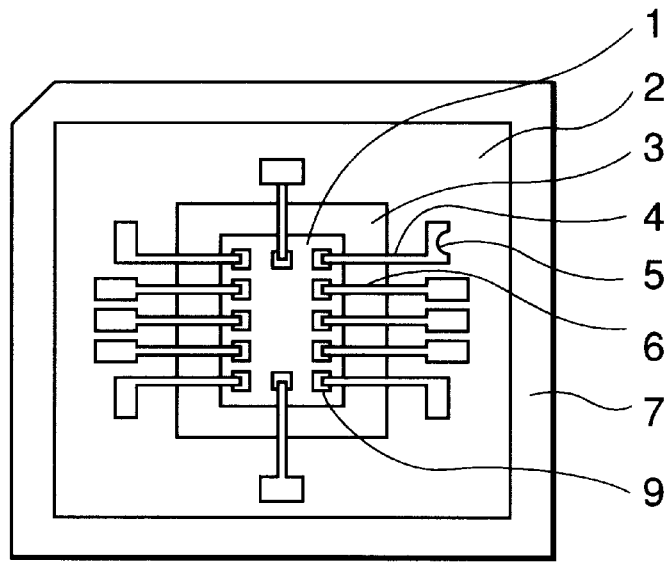
FIG. 1 is a plan view showing one prior art.
Figure 2:
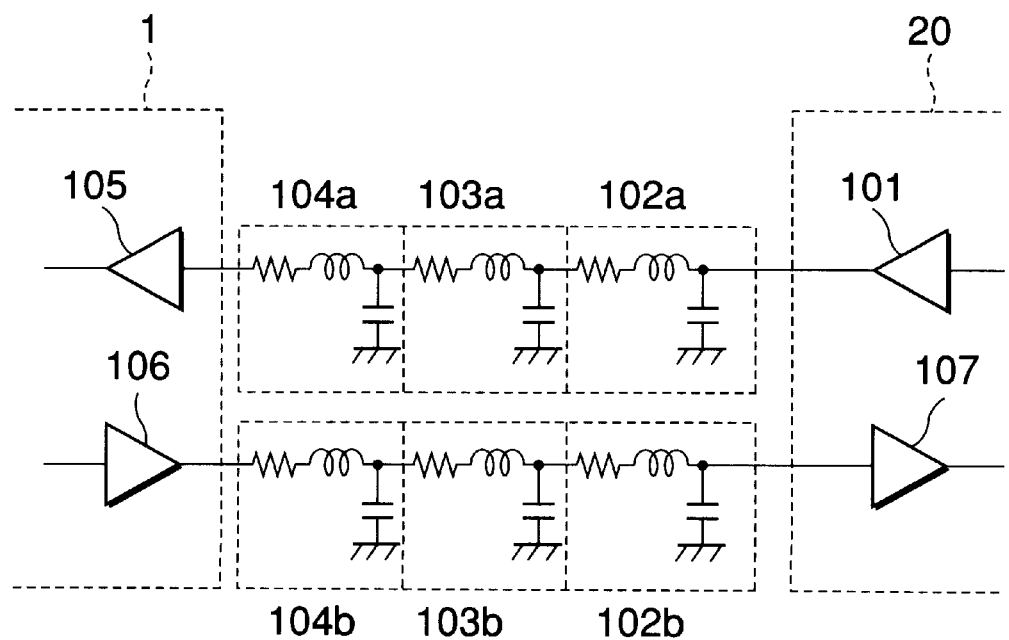
FIG. 2 is an equivalent circuit diagram showing the connection state of an LSI tester in order to explain problems of the prior art.
Figure 3:
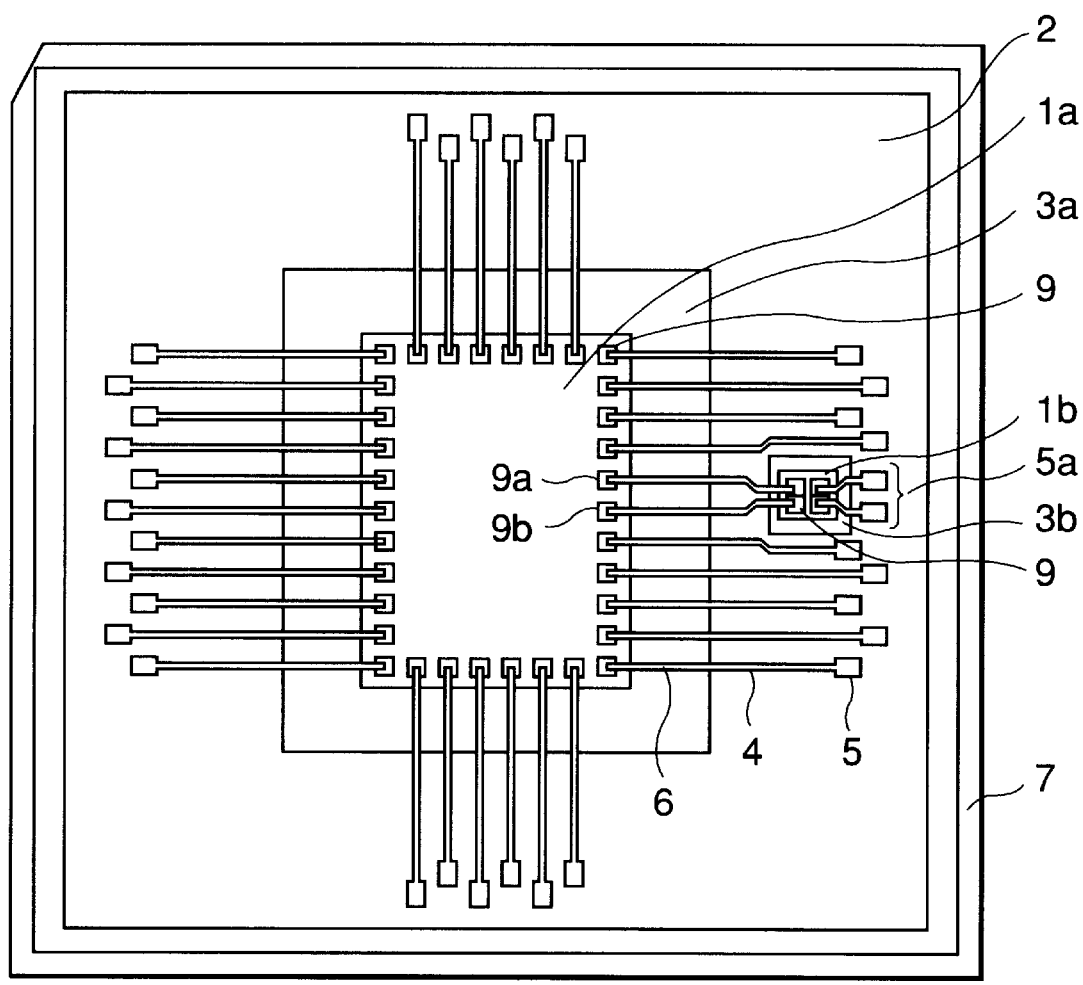
FIG. 3 is a plan view showing the first embodiment of the present invention.

FIG. 3 is a plan view of a TAB tape semiconductor device according to the first embodiment of the present invention. Two device holes 3a and 3b are formed in a resin tape 2, and wiring patterns 4 each having one end formed with a test pad 5 are formed on the resin tape 2. The extending portions of the wiring patterns 4 above the device holes form inner leads 6.

An integrated circuit chip 1a and a waveform shaping integrated circuit chip 1b are mounted in the device holes 3a and 3b, respectively, and the distal end portions of the inner leads 6 are bonded to chip pads 9 of the respective chips 1a and 1b. Some chip pads 9 on the waveform shaping integrated circuit chip 1b are connected to test pads 5a through corresponding wiring patterns, and other chip pads are connected to chip pads 9a and 9b on the integrated circuit chip 1a through corresponding wiring patterns.

A test using an LSI tester is performed in the following manner. Probes mounted on the test board are brought into contact with the test pads 5a and 5b, and signals from the LSI tester are supplied to the TAB tape through the test board. The waveform shaping integrated circuit chip 1b shapes the waveforms of clocks supplied from the LSI tester to output signals free from a phase shift to the chip pads 9a and 9b serving as the two-phase clock input terminals of the integrated circuit chip 1a.

The integrated circuit chip 1a performs a processing operation based on the waveform-shaped two-phase clocks free from the phase shift, and the processing result is transmitted to the LSI tester through the probe of the test board which is in contact with the test pad 5.

According to this test method, clocks free from a blunt and phase shift are supplied to the integrated circuit chip 1a, so that high-precision evaluation of this chip can be performed.

When packaging the integrated circuit chip 1a in a package, the waveform shaping integrated circuit chip 1b is not utilized but is disposed of. Alternatively, the waveform shaping integrated circuit chip 1b is removed from the TAB tape and is reused.

Figure 4:
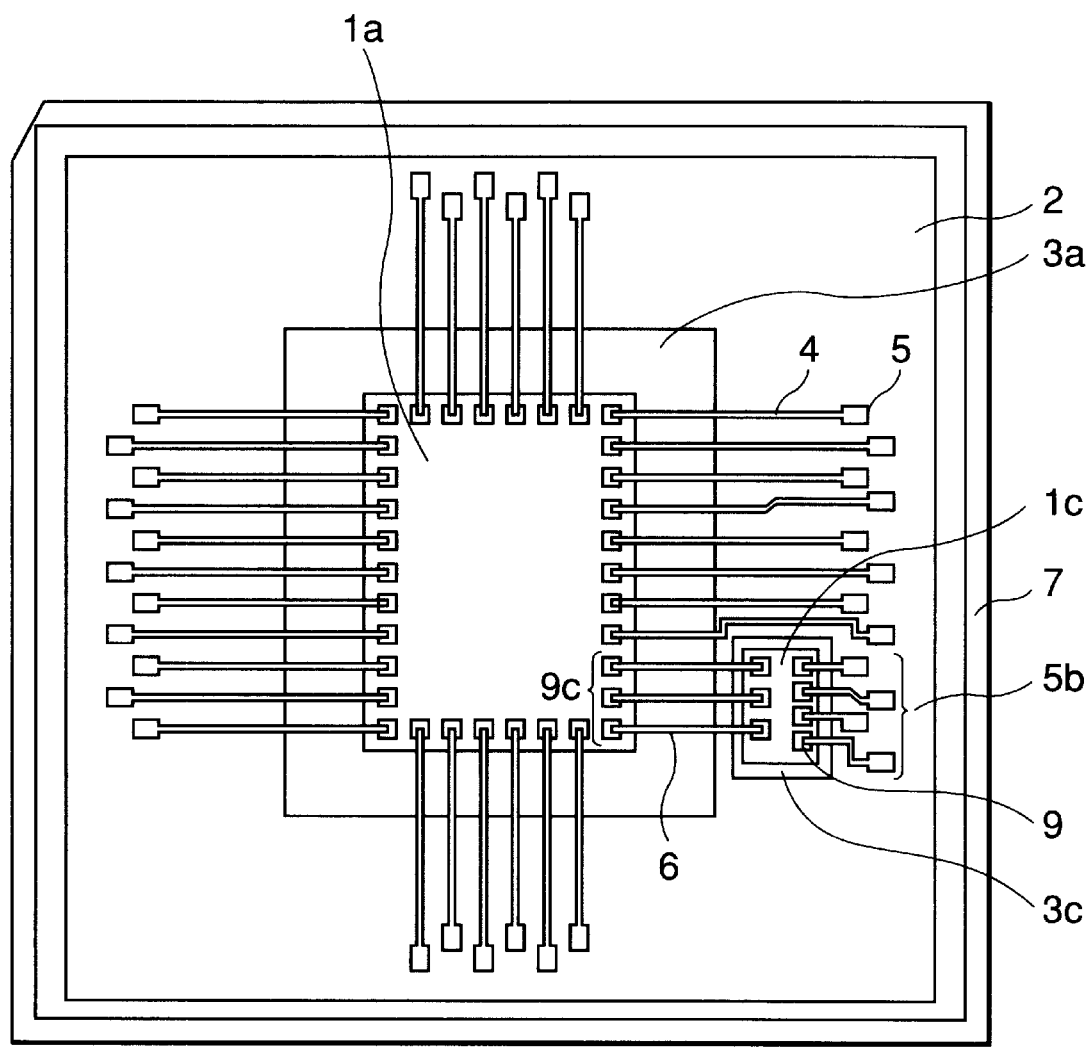
FIG. 4 is a plan view showing the second embodiment of the present invention.

FIG. 4 is a plan view of a TAB tape semiconductor device according to the second embodiment of the present invention. Referring to FIG. 4, portions that are identical to those of the embodiment shown in FIG. 3 are denoted by the same reference numerals as in FIG. 3. Two device holes 3a and 3c are formed in a resin tape 2, in the same manner as in the embodiment shown in FIG. 3. An integrated circuit chip 1a is mounted in the device hole 3a at the central portion, and a macro-testing integrated circuit chip 1c is mounted in the device hole 3c in the periphery.

Some chip pads 9 formed on the macro-testing integrated circuit chip 1c are connected to test pads 5b through corresponding wiring patterns 4, and other chip pads thereon are connected to chip pads 9c on the integrated circuit chip 1a through corresponding wiring patterns 4.

The macro-testing integrated circuit chip 1c has a circuit for testing the function of the macro-element, e.g., an SRAM, incorporated in the integrated circuit chip 1a, and performs the test through the chip pads 9c serving as the macro-test terminals. More specifically, the macro-testing integrated circuit chip 1c receives a mode signal, a test clock signal, and the like from the LSI tester through the test pads 5b, and generates a test signal based on the received signals to test the integrated circuit chip 1a at a high-speed frequency. Since the integrated circuit chips 1a and 1c are mounted on the same TAB tape, no large blunt occurs in the waveforms of the signals transferred between them, and a high-speed test can be performed. If a defective chip is detected, the macro-testing integrated circuit chip 1c outputs a detection signal to one of the test pads 5b.

When the integrated circuit chip 1a is packaged in a package, the macro-testing integrated circuit chip 1c is disconnected and disposed of. Alternatively, the macro-testing integrated circuit chip 1c is disconnected and recovered to be reused by another TAB tape.

Figure 5:
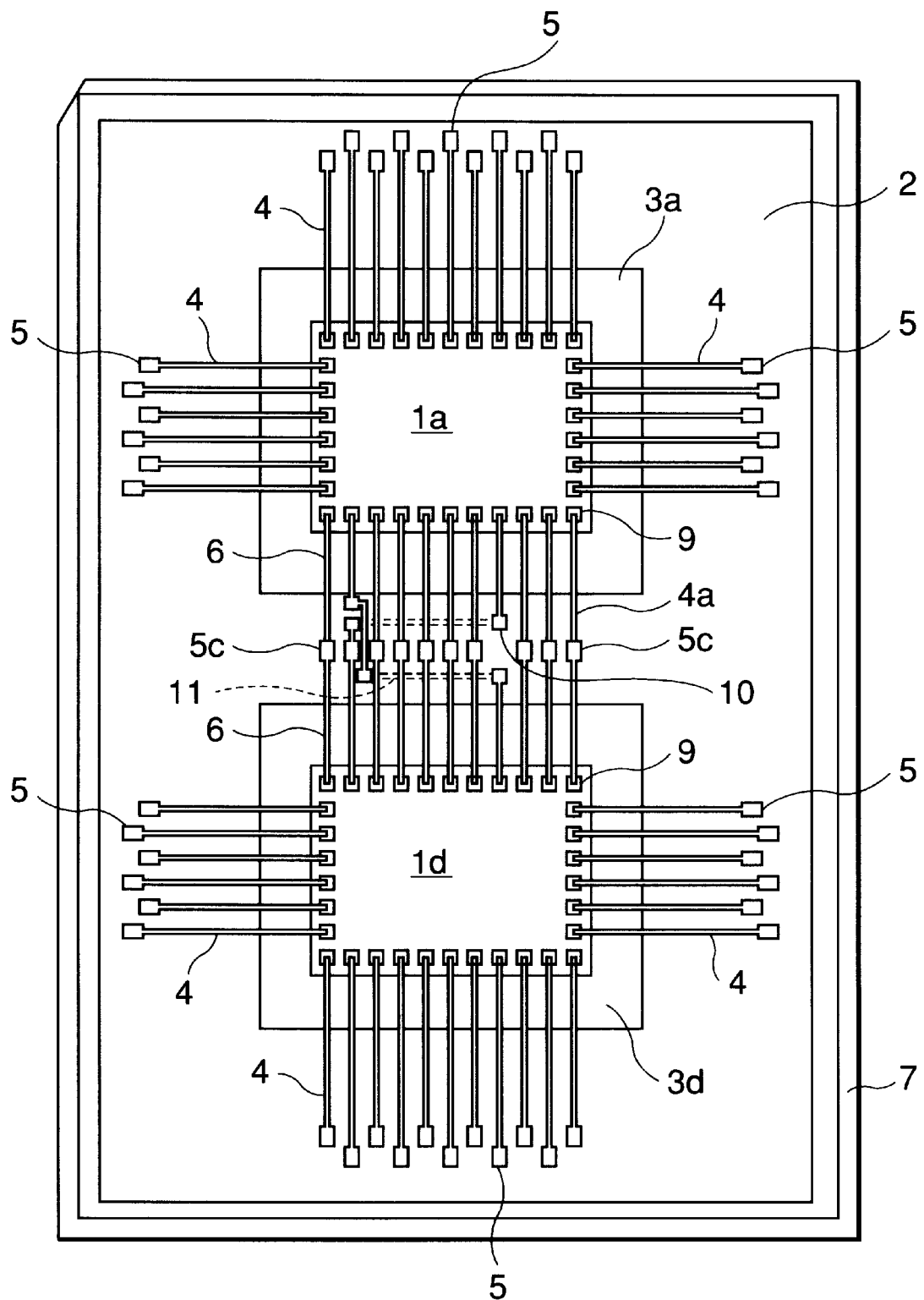
FIG. 5 is a plan view showing the third embodiment of the present invention.

FIG. 5 is a plan view of a TAB tape semiconductor device according to the third embodiment of the present invention. Referring to FIG. 5, portions that are identical to those of the embodiment shown in FIG. 3 are denoted by the same reference numerals as in FIG. 3. Two device holes 3a and 3d are formed in a resin tape 2 of this embodiment. Integrated circuit chips 1a and 1d respectively mounted in the device holes 3a and 3d are electrically connected to each other through wiring patterns 4a on the resin tape 2, or through the wiring patterns 4a, through holes 10, and lower surface wiring patterns 11, so that they realize one function as a device. Input/output signal test pads 5 are arranged as the interface of the device on the peripheral portion of the resin tape 2. Furthermore, test pads 5c for testing the respective integrated circuit chips 1a and 1d are prepared on the wiring patterns 4a that connect the integrated circuit chips 1a and 1d to each other.

Usually, in the test, signals from the LSI test are input through the interface test pads 5 on the resin tape 2, to test the function of the integrated circuit chips 1a and 1d as one system. At this time, it suffices if signals that are input to and output from the actual system are input and output, and patterns for testing the respective integrated circuit chips are not needed. Since the respective integrated circuit chips are connected to each other through short wires, a high-speed function test can be performed. Simultaneously, the operations of the individual integrated circuit chips can be confirmed through the test pads 5c.

After the test is ended, the integrated circuit chips 1a and 1d are packaged in separate packages.

So far the embodiments in which the TAB tape units are accommodated in corresponding frames have been described. The present invention is not limited to these embodiments, but can similarly be applied to a TAB tape semiconductor device which is provided in the form of a long device.

What I claim is:

1. A tape automated bonding (TAB) device comprising:

a resin tape having at least one device hole therein;

a semiconductor device in said at least one device hole;

said tape further comprising at least one tester hole therein, each said at least one tester hole being associated with and adjacent to a respective said at least one device hole; and a tester generating a test signal in said at least one tester hole, said tester being electrically connected to a respective said semiconductor device in the associated said device hole and providing the test signal to the respective semiconductor device.

2. The TAB device of claim 1, wherein said semiconductor device further comprises a plurality of leads that each extend from said device to respective bonding pads on said resin tape, wherein said bonding pads are spaced from said device no less than a first distance, and wherein the one said tester associated with said device is spaced from said device by no more than said first distance.

3. The TAB device of claim 1, wherein said at least one tester is a single purpose device that is one of a waveform shaping device and a function testing device.

* * * * *